United States Patent [19]
Crayford et al.

[11] Patent Number: 6,151,316
[45] Date of Patent: Nov. 21, 2000

[54] APPARATUS AND METHOD FOR SYNTHESIZING MANAGEMENT PACKETS FOR TRANSMISSION BETWEEN A NETWORK SWITCH AND A HOST CONTROLLER

[75] Inventors: Ian Crayford, San Jose; Denise Kerstein, Palo Alto, both of Calif.

[73] Assignee: Advanced Micro Devices, Inc., Sunnyvale, Calif.

[21] Appl. No.: 08/992,425

[22] Filed: Dec. 18, 1997

Related U.S. Application Data

[60] Provisional application No. 60/038,025, Feb. 14, 1997.

[51] Int. Cl.⁷ .................................................. H04L 12/66
[52] U.S. Cl. ............................................................ 370/356
[58] Field of Search .................................... 370/410, 229, 370/241–8, 401–2, 422, 428, 356; 709/223, 224

[56] References Cited

U.S. PATENT DOCUMENTS

| | | |
|---|---|---|
| 5,515,376 | 5/1996 | Murthy et al. |
| 5,778,058 | 7/1998 | Gavin .................................... 379/225 |
| 5,982,767 | 11/1999 | McIntosh .............................. 370/352 |
| 5,996,010 | 11/1999 | Leong et al. .......................... 709/223 |
| 6,003,077 | 12/1999 | Bawden et al. ....................... 709/223 |

FOREIGN PATENT DOCUMENTS 0 495 575 A1   7/1992   European Pat. Off. .

OTHER PUBLICATIONS

"Architecture for Stackable Hub Management", IBM Technical Disclosure Bulletin, vol. 39, No. 2, Feb. 1996, pp. 3–9.
IBM: "Dedicated Network Management through Port Segmentation" IBM Technical Disclosure Bulletin, vol. 38, No. 5, May 1995, Armonk, pp. 75–78.

Primary Examiner—Douglas W. Olms
Assistant Examiner—David R Vincent

[57] ABSTRACT

Management data is supplied to a management agent by a network switch by generating management packets having at least a portion of a received data packet, and management information specifying receive status and network switch response characteristics to the corresponding received data packet. The network switch includes a plurality of network ports, including network traffic ports and one management port for synthesizing the management frame. A network traffic port receiving a data packet generates receive status data specifying the reception status of the received data packet, including the presence of cyclic redundancy check (CRC) errors, frame alignment errors, and receive buffer overflow conditions. The received data packet and received status data are stored in a buffer memory, while switching logic generates port vectors specifying destination output ports and switching logic data specifying the switching logic response to the received data packet. The management port selectively compiles the received status data, the switching logic data, and at least a portion of the received data frame into a management frame, and outputs the synthesized management frame to a management agent according to a media access control (MAC) layer protocol. The generation of management frame provides detailed management information corresponding to characteristics of the received data packet and the corresponding network switch response, independent of the timing at which the data packet was received by the network switch.

31 Claims, 11 Drawing Sheets

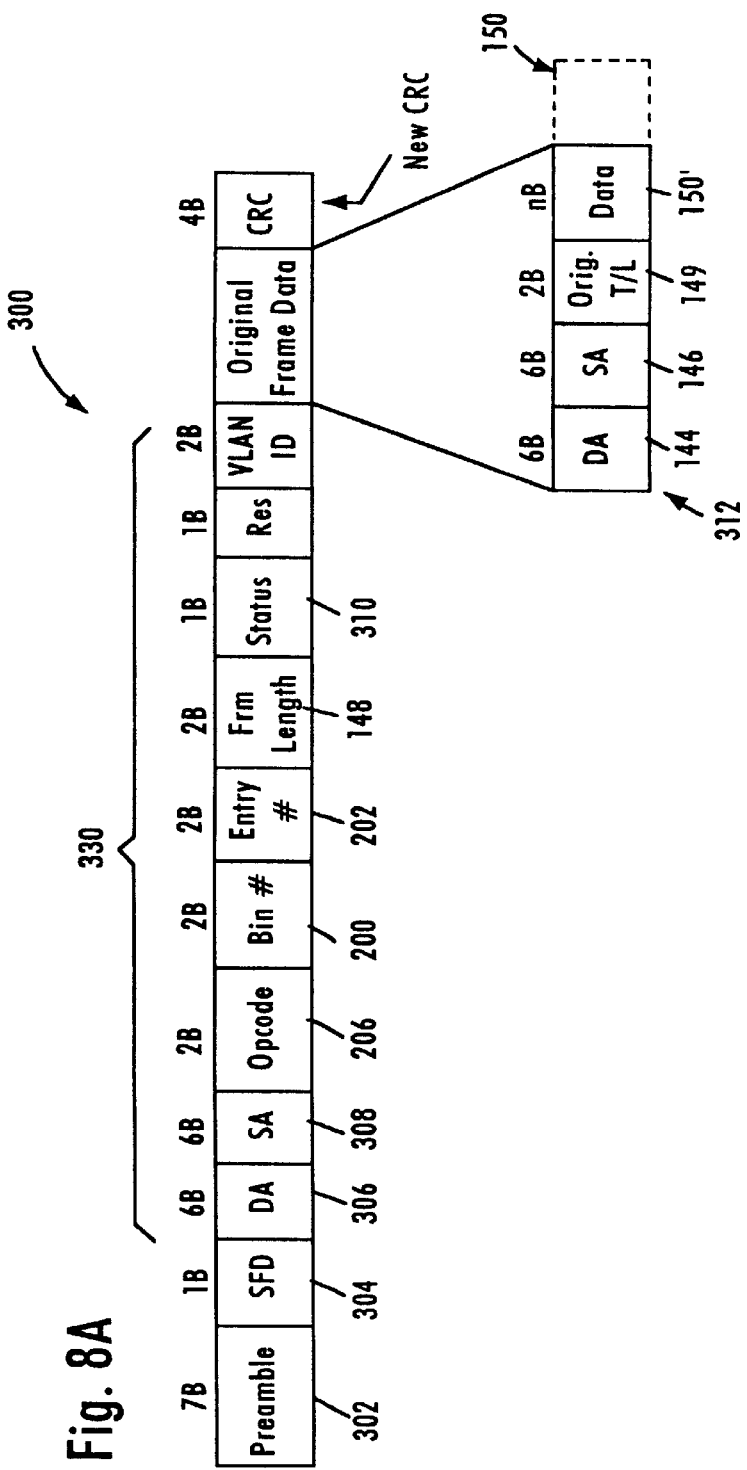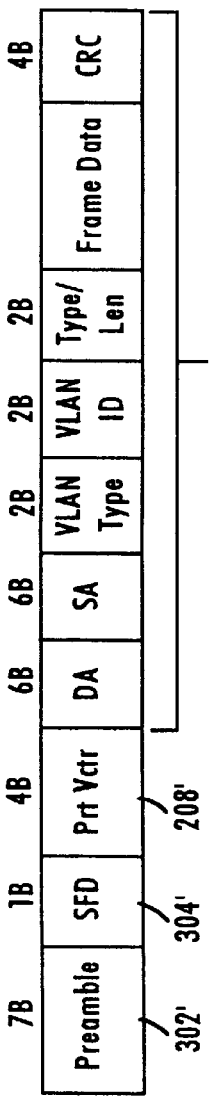

APPARATUS AND METHOD FOR SYNTHESIZING MANAGEMENT PACKETS FOR TRANSMISSION BETWEEN A NETWORK SWITCH AND A HOST CONTROLLER

RELATED APPLICATIONS

This application claims priority from provisional patent application Serial No. 60/038,025, filed Feb. 14, 1997, entitled INTEGRATED MULTIPORT SWITCH (attorney docket 1033-230PRO), which is incorporated herein by reference.

TECHNICAL FIELD

The present invention relates to network switching and more particularly, to a method and apparatus providing management data between a network switch and a host computer controlling the network switch.

BACKGROUND ART

Switched local area networks use a network switch for supplying data frames between network stations, where each network station is connected to the network switch by a media. The switched local area network architecture uses a media access control (MAC) enabling a network interface card to access the media. The network switch passes data frames received from a transmitting station to a destination station based on the header information in the received data frame.

Networks typically will include a management agent that monitors activity by a hub or repeater. The management agent may include analysis and/or diagnostic equipment and may be concerned with statistical information related to the network in order to identify how well a network is being utilized. Such statistical information may include what types of packets are on the network, what protocols are being used on the network, the packet sender identity, the packet receiver identity, and the distribution of the of the packet lengths being transferred on the network.

Network repeaters will typically send management information to the management agent on a MAC layer protocol. For example, commonly-assigned U.S. Pat. No. 5,592,486 discloses a repeater that compares a destination address of a received data packet with a destination address corresponding to a management unit address. The data packet is compressed if its destination address does not match the stored management unit address, where transmission of the data packet to the management unit is halted once the counted number of bytes matches a predetermined number. A valid frame check sequence (FCS) is then provided at the end of the compressed data packet following transmission of the received data packet.

Commonly-assigned U.S. Pat. No. 5,550,803 also provides a MAC-layer transmission of received data packets to a management unit, where the data portion of a received data packet is transferred by a repeater to a management unit. Statistical information is then appended to the data portion following transmission of the received data packet during an interpacket gap interval.

The above-disclosed arrangements are beneficial for network systems having repeater devices, since a repeater device has a shared medium with all network devices, requiring transmission of a single data packet at a time under Ethernet (IEEE 802.3) protocol. Switched network architectures using a network switch, however, are configured for simultaneously transmitting and receiving a plurality of data packets on network ports serving respective network stations. Hence, the technique of halting transmission of a received data packet after a prescribed number of bytes, followed by appending additional data after complete reception of the received data packet results in wasted bandwidth during the idle time between halted transmission and the appended additional data. Moreover, this technique does not contemplate multiple data packets simultaneously received by a network switch. Appending the statistical information at the end of the data packet also requires the management agent to wait until the entire packet is received before determining the nature of the data packet (i.e., why the data packet was received). Finally, the statistical information tagged (i.e., appended) to the end of the data packet generally includes only statistics related to the actual received data packet.

SUMMARY OF THE INVENTION

There is a need for an arrangement that provides management information to a host management agent via a management media access control (MAC) port in a network switch that simultaneously sends and receives data packets between respective network stations.

There is also a need for an arrangement for generating a management data frame to be transmitted to the management agent, where the management frame includes at least a portion of a selected received data frame and new information specifying characteristics corresponding to the reception of the selected data frame.

There is also a need for an arrangement that generates a management data frame for a management agent, where the management data frame includes new information corresponding to a characteristic of a network switch receiving the data packet.

There is also a need for an arrangement in a network switch receiving a data packet for generating a new data packet, independent from the time a data packet is received, that includes new information specifying characteristics corresponding to the reception of the received data packet.

These and other needs are attained by the present invention, where a network switch receiving a data packet generates a new data packet for transmission to a management agent, where the new data packet includes new information specifying characteristics corresponding to the reception of the received data packet.

According to one aspect of the present invention, a method in a network switch includes the steps of receiving a data packet from a network station, generating new information in response to reception of the received data packet, and outputting for use by a management agent a new data packet including the new information and at least a portion of the received data packet, the new information specifying characteristics corresponding to the reception of the received data packet. The new information generated in response to reception of the received data packet may include information about the reception of the data packet, as well as characteristics relating to the network switch during the reception of the received data packet. Moreover, the generation and output of the new data packet is independent of the time the network switch receives the received data packet, enabling the network switch to output the new data packet to the management agent as the network station is simultaneously transmitting and receiving several data packets from respective network stations. Hence, a management agent is capable of obtaining a stream of new management data packets carrying management information related to the network switch and the receive status of received data packets, without any interruption in the network traffic between the switch and the respective network stations.

Another aspect of the present invention provides a network switch comprising a plurality of network ports configured for sending and receiving data frames to and from respective network stations, a management port configured for sending a management data frame to a management agent, the management data frame including at least a portion of a selected received data frame and new information specifying characteristics corresponding to the reception of the selected data frame, and a switching subsystem configured for generating a least a portion of the new information for the corresponding selected received data frame. The switching subsystem identifies a selected received data frame and generates new information specifying the characteristics of the selected received data frame, which is used by the management port to generate a new management data frame including the new information and at least a portion of the selected received data frame. Hence, the network switch enables identification of selected received data frames based upon prescribed conditions, and outputs a management data frame that includes new information specifying characteristics corresponding to the reception of the selected data frame, including received status information and/or characteristics of the switch in response to reception of the data frame.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout and wherein:

FIGS. 8A and 8B are diagrams illustrating the management packet transmitted and received by the management port of the network switch of FIG. 1, respectively.

DETAILED DESCRIPTION OF ILLUSTRATED EMBODIMENTS

The present invention will be described with the example of a switch in a packet switched network, such as an Ethernet (IEEE 802.3) network. A description will first be given of the switch architecture, followed by the arrangement for generating a management frame according to the present invention. It will become apparent, however, that the present invention is also applicable to other packet switched systems, as described in detail below.

SWITCH ARCHITECTURE

Figure 1:
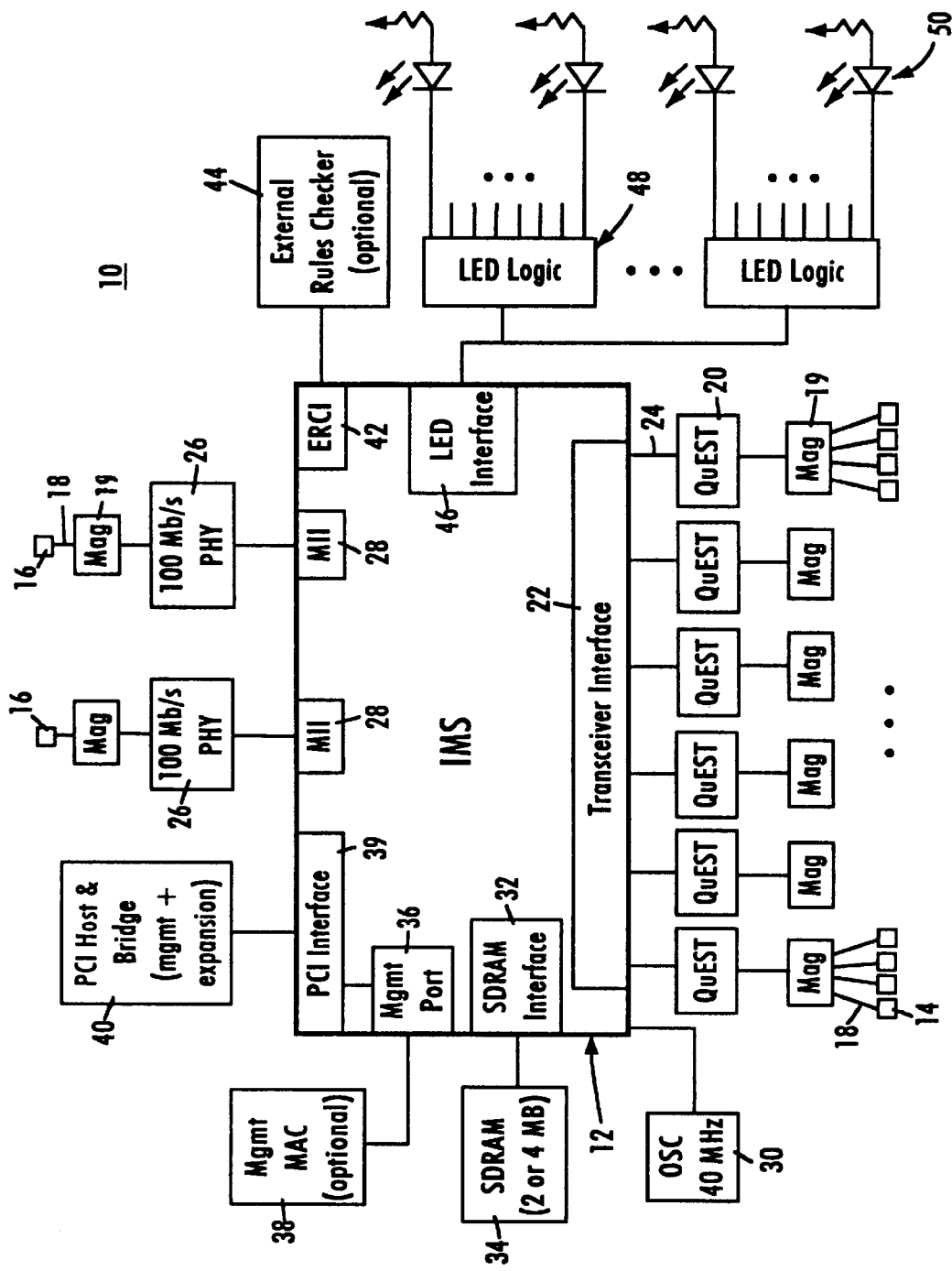
FIG. 1 is a block diagram of a packet switched system constructed in accordance with an embodiment of the present invention.

FIG. 1 is a block diagram of an exemplary system in which the present invention may be advantageously employed. The exemplary system 10 is a packet switched network, such as an Ethernet network. The packet switched network includes an integrated multiport switch (IMS) 12 that enables communication of data packets between network stations. The network may include network stations having different configurations, for example twenty-four (24) 10 megabit per second (Mb/s) network stations 14 that send and receive data at a network data rate of 10 Mb/s, and two 100 Mb/s network stations 16 that send and receive data packets at a network speed of 100 Mb/s. The multiport switch 12 selectively forwards data packets received from the network stations 14 or 16 to the appropriate destination based upon Ethernet protocol.

According to the disclosed embodiment, the 10 Mb/s network stations 14 send and receive data packets to and from the multiport switch 12 via a media 18 and according to half-duplex Ethernet protocol. The Ethernet protocol ISO/IEC 8802-3 (ANSI/IEEE Std. 802.3, 1993 Ed.) defines a half-duplex media access mechanism that permits all stations 14 to access the network channel with equality. Traffic in a half-duplex environment is not distinguished or prioritized over the medium 18. Rather, each station 14 includes an Ethernet interface card that uses carrier-sense multiple access with collision detection (CSMA/CD) to listen for traffic on the media. The absence of network traffic is detected by sensing a deassertion of a receive carrier on the media. Any station 14 having data to send will attempt to access the channel by waiting a predetermined time after the deassertion of a receive carrier on the media, known as the interpacket gap interval (IPG). If a plurality of stations 14 have data to send on the network, each of the stations will attempt to transmit in response to the sensed deassertion of the receive carrier on the media and after the IPG interval, resulting in a collision. Hence, the transmitting station will monitor the media to determine if there has been a collision due to another station sending data at the same time. If a collision is detected, both stations stop, wait a random amount of time, and retry transmission.

The 100 Mb/s network stations 16 preferably operate in full-duplex mode according to the proposed Ethernet standard IEEE 802.3x Full-Duplex with Flow Control—Working Draft (0.3). The full-duplex environment provides a two-way, point-to-point communication link between each 100 Mb/s network station 16 and the multiport switch 12, where the IMS and the respective stations 16 can simultaneously transmit and receive data packets without collisions. The 100 Mb/s network stations 16 each are coupled to network media 18 via 100 Mb/s physical (PHY) devices 26 of type 100 Base-TX, 100 Base-T4, or 100 Base-FX. The multiport switch 12 includes a media independent interface (MII) 28 that provides a connection to the physical devices 26. The 100 Mb/s network stations 16 may be implemented as servers or routers for connection to other networks. The 100 Mb/s network stations 16 may also operate in half-duplex mode, if desired. Similarly, the 10 Mb/s network stations 14 may be modified to operate according to full-duplex protocol with flow control.

As shown in FIG. 1, the 10 Mb/s network stations 14 each are coupled to the network media 18 via 10 Mb/s transceiver (QuEST) devices 20 of type 10 BASE-T. The network 10 includes a series of switch transceivers 20 that perform time division multiplexing and time division demultiplexing for data packets transmitted between the multiport switch 12 and the 10 Mb/s stations 14. A magnetic transformer module 19 maintains the signal waveform shapes on the media 18. The multiport switch 12 includes a transceiver interface 22 that transmits and receives data packets to and from each switch transceiver 20 using a time-division multiplexed protocol across a single serial non-return to zero (NRZ) interface 24. The switch transceiver 20 receives packets from the serial NRZ interface 24, demultiplexes the received packets, and outputs the packets to the appropriate end station 14 via the network media 18. According to the disclosed embodiment, each switch transceiver 20 has four independent 10 Mb/s twisted-pair ports and uses 4:1 multiplexing across the serial NRZ interface enabling a four-fold reduction in the number of pins required by the multiport switch 12.

The multiport switch 12 contains a decision making engine, switching engine, buffer memory interface, configuration/control/status registers, management counters, and MAC (media access control) protocol interface to support the routing of data packets between the Ethernet ports serving the network stations 14 and 16. The multiport switch 12 also includes enhanced functionality to make intelligent switching decisions, and to provide statistical network information in the form of management information base (MIB) objects to an external management entity, described below. The multiport switch 12 also includes interfaces to enable external storage of packet data and switching logic in order to minimize the chip size of the multiport switch 12. For example, the multiport switch 12 includes a synchronous dynamic RAM (SDRAM) interface 32 that provides access to an external memory 34 for storage of received frame data, memory structures, and MIB counter information. The memory 34 may be an 80, 100 or 120 MHz synchronous DRAM having a memory size of 2 or 4 Mbytes.

The multiport switch 12 also includes a management port 36 that enables an external management entity to control overall operations of the multiport switch 12 by a management MAC interface 38. As described in detail below, the management port 36 outputs management frames having at least a portion of a selected received data packet and new information providing management information. The multiport switch 12 also includes a PCI interface 39 enabling access by the management entity via a PCI host and bridge 40. Alternatively, the PCI host and bridge 40 may serve as an expansion bus for a plurality of IMS devices 12. Received packets may also be forwarded to the PCI interface 39 based on the result from the decision making engine.

The multiport switch 12 includes an internal decision making engine that selectively determines the forwarding of data packets received from one source to at least one destination station, the PCI interface 39, or the management port 36. The internal decision making engine may be substituted with an external rules checker. The multiport switch 12 includes an external rules checker interface (ERCI) 42 that allows use of an external rules checker 44 to make frame forwarding decisions in place of the internal decision making engine. Hence, frame forwarding decisions can be made either by the internal switching engine or the external rules checker 44.

The multiport switch 12 also includes an LED interface 46 that clocks out the status of conditions per port and drives LED external logic 48. The LED external logic 48, in turn, drives LED display elements 50 that are human readable. An oscillator 48 provides a 40 MHz clock input for the system functions of the multiport switch 12.

Figure 2:
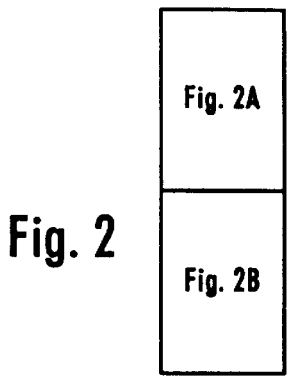
FIGS. 2, 2A and 2B are block diagrams of a multiport switch constructed in accordance with an embodiment of the present invention and used in the packet switched system of FIG. 1.
Figure 2A:
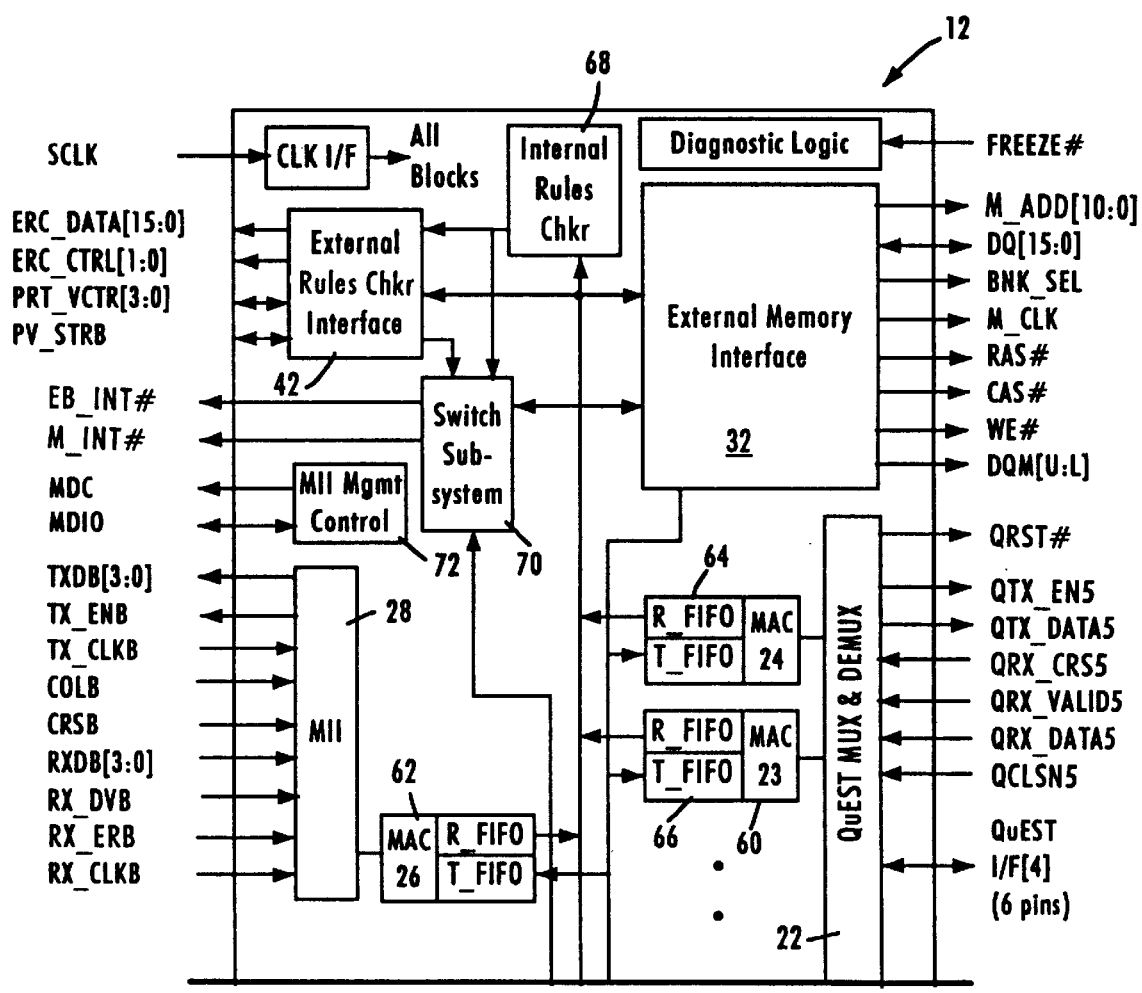
Figure 2B:
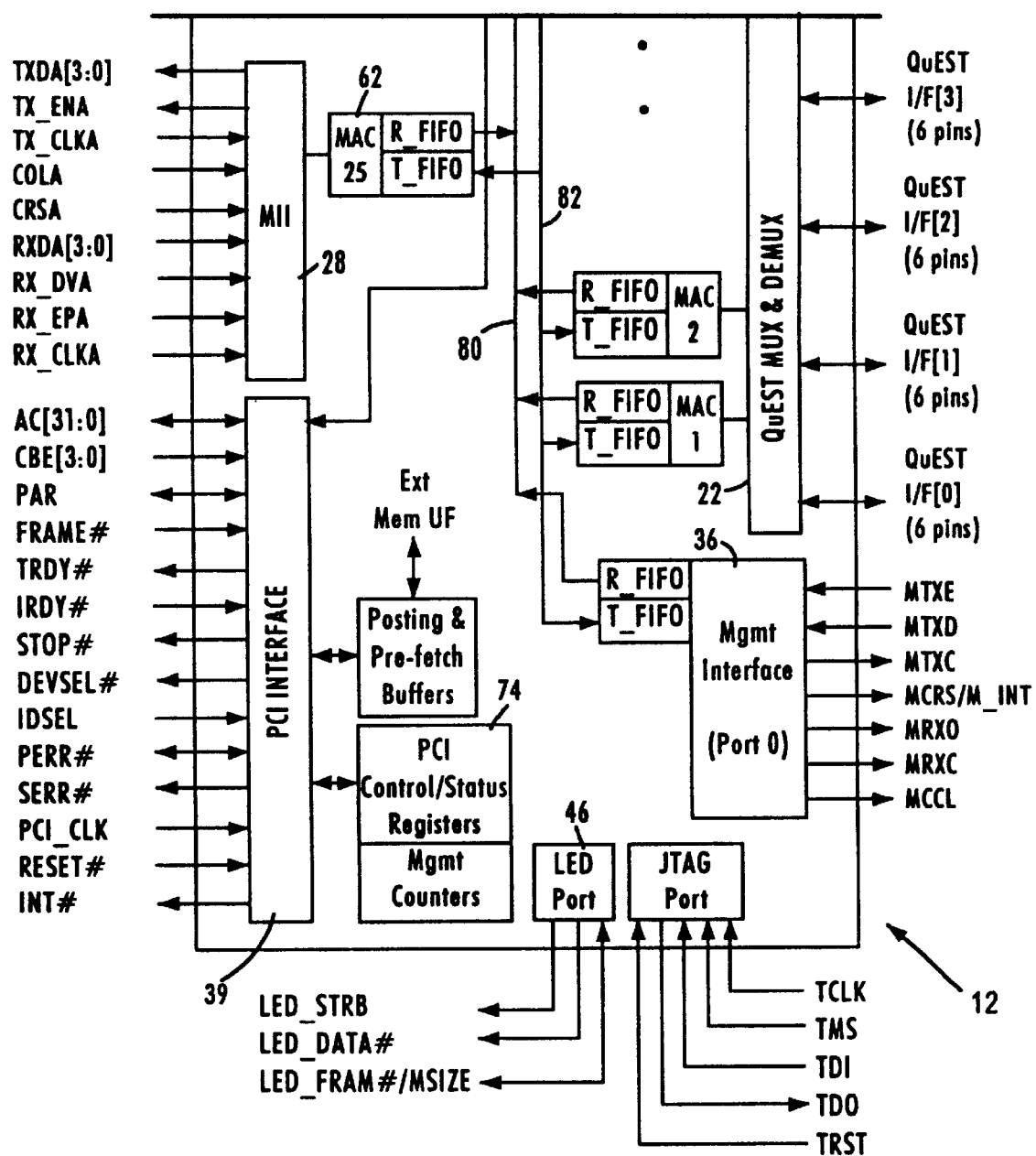

FIG. 2 is a block diagram of the multiport switch 12 of FIG. 1. The multiport switch 12 includes twenty-four (24) 10 Mb/s media access control (MAC) ports 60 for sending and receiving data packets in half-duplex between the respective 10 Mb/s network stations 14 (ports 1–24), and two 100 Mb/s MAC ports 62 for sending and receiving data packets in full-duplex between the respective 100 Mb/s network stations 16 (ports 25, 26). As described above, the management interface 36 also operates according to MAC layer protocol (port 0). Each of the MAC ports 60, 62 and 36 has a receive first in-first out (FIFO) buffer 64 and transmit FIFO 66. Data packets from a network station are received by the corresponding MAC port and stored in the corresponding receive FIFO 64. The received data packet is output from the corresponding receive FIFO 64 to the external memory interface 32 for storage in the external memory 34.

The header of the received packet is also forwarded to a decision making engine, comprising an internal rules checker 68 and an external rules checker interface 42, to determine which MAC ports will output the data packet. Specifically, the packet header is forwarded to an internal rules checker 68 or the external rules checker interface 42, depending on whether the multiport switch 12 is configured to operate using the internal rules checker 68 or the external rules checker 44. The internal rules checker 68 and external rules checker 44 provide the decision making logic for determining the destination MAC port for a given data packet. The decision making engine may thus output a given data packet to either a single port, multiple ports, or all ports (i.e., broadcast). For example, each data packet includes a header having source and destination address, where the decision making engine may identify the appropriate output MAC port based upon the destination address. Alternatively, the destination address may correspond to a virtual address that the appropriate decision making engine identifies as corresponding to a plurality of network stations. Alternatively, the received data packet may include a VLAN (virtual LAN) tagged frame according to IEEE 802.1d protocol that specifies another network (via a router at one of the 100 Mb/s stations 16) or a prescribed group of stations. Hence, either the internal rules checker 68 or the external rules checker 44 via the interface 42 will decide whether a frame temporarily stored in the buffer memory 34 should be output to a single switch port or multiple switch ports.

Use of the external rules checker 44 provides advantages such as increased capacity, a random-based ordering in the decision queue that enables frame forwarding decisions to be made before the frame is completely buffered to external memory, and enables decisions to be made in an order independent from the order in which the frames were received by the multiport switch 12.

The decision making engine (i.e., internal rules checker 68 or the external rules checker 44) outputs a forwarding decision to a switch subsystem 70 in the form of a port vector identifying each switch port that should receive the data packet. The port vector from the appropriate rules checker includes the address location storing the data packet in the external memory 34, and the identification of the MAC ports to receive the data packet for transmission (e.g., MAC ports 0–26). The switch subsystem 70 fetches the data packet identified in the port vector from the external memory 34 via the external memory interface 32, and supplies the retrieved data packet to the appropriate transmit FIFO 66 of the identified ports, and/or the PCI interface 39.

Additional interfaces provide management and control information. For example, a management data interface 72 enables the multiport switch 12 to exchange control and status information with the switch transceivers 20 and the 100 Mb/s physical devices 26 according to the MII management specification (IEEE 802.3u). For example, the management data interface 72 outputs a management data clock (MDC) providing a timing reference on the bidirectional management data IO (MDIO) signal path.

The PCI interface 39 is a 32-bit PCI revision 2.1 compliant slave interface for access by the PCI host processor 40 to internal IMS status and configuration registers 74, and access external memory SDRAM 34. The PCI interface 39 can also serve as an expansion bus for multiple IMS devices. The management port 36 interfaces to an external MAC engine through a standard seven-wire inverted serial GPSI port, enabling a host controller access to the multiport switch 12 via a standard MAC layer protocol.

Figure 3:
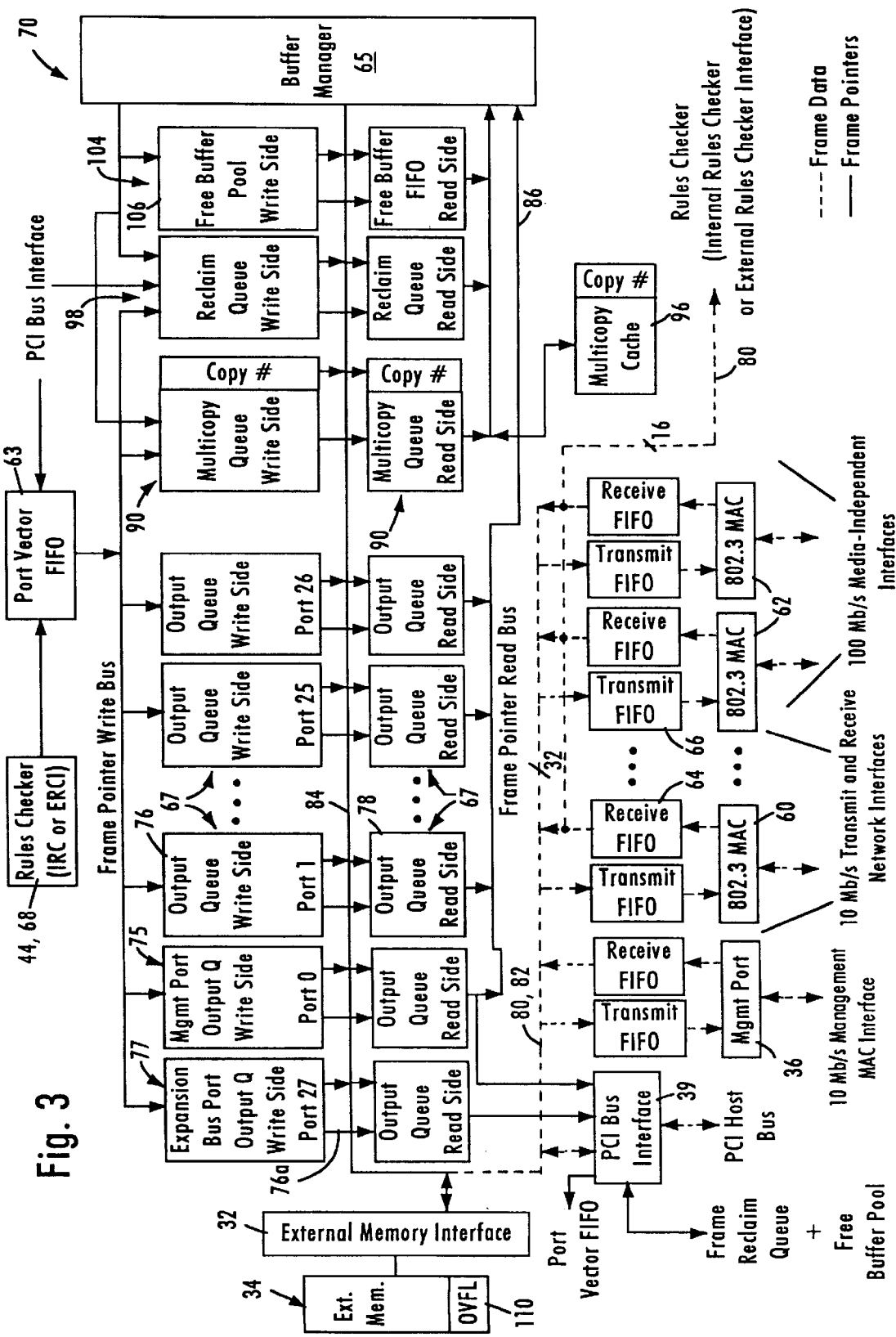
FIG. 3 is a schematic depiction of a switched subsystem of the multiport switch of FIG. 2, constructed in accordance with an embodiment of the present invention.

FIG. 3 depicts the switch subsystem 70 of FIG. 2 according to an exemplary embodiment of the present invention. Other elements of the multiport switch 12 of FIG. 2 are reproduced in FIG. 3 to illustrate the connections of the switch subsystem 70 to these other elements. The switch subsystem 70 contains the core switching engine for receiving and forwarding frames. The main functional blocks used to implement the switching engine include: a port vector FIFO 63, a buffer manager 65, a plurality of port output queues 67, a management port output queue 75, an expansion bus port output queue 77, a free buffer pool 104, a multicopy queue 90, a multicopy cache 96 and a reclaim queue 98. The operation and structure of these functional blocks will be described in more detail, but a brief overview of the switch subsystem 70 of FIG. 3 is first presented to provide context to the later discussion of the individual elements.

There are two basic types of frames that enter the multiport switch 12 from the ports: unicopy frames and multicopy frames. A unicopy frame is a frame that is received at a port which is to be transmitted by the multiport switch 12 to only one other port. By contrast, a multicopy frame is a frame that is received at one port for transmission to more than one port. In FIG. 3, each port is represented by a corresponding MAC 60, 62, or 36 having its own receive FIFO 64 and transmit FIFO 66. The PCI interface may also be used to forward a received packet.

Frames, whether unicopy or multicopy, are received by the internal MAC engines 60, 62, or 36, and placed in the corresponding receive FIFO 64. Each data frame has a header including at least a destination address, a source address, and type/length information. The header is provided to a rules checker (i.e., either the internal rules checker 68 or the external rules checker interface 42). The rules checker, based on the information in the header, determines from where the frame packet will be cast, i.e., through which port or ports will the frame packet be transmitted.

At the same time as the rules checker 44 or 68 is making its forwarding determination, the buffer manager 65 obtains a free frame pointer from the free buffer pool 104. The free frame pointer specifies a location in external memory 36 available for storing the data frame currently stored in the receive FIFO 64. The buffer manager 65 transfers the data frame from the receive FIFO 64 over a data bus 80 (see FIG. 2) to the external memory 34 in a direct memory access (DMA) transaction, and the data frame is stored in the location pointed to by the free frame pointer obtained from the free buffer pool 104.

The buffer manager 65 also sends the free frame pointer to the rules checker 44 or 68 to enable the appropriate rules checker to process the header information while maintaining the storage location of the data frame. This free buffer pointer is now referred to merely as a frame pointer, since it points to the memory location in the external memory 34 where the frame is stored. The rules checker 44 or 68 makes the forwarding decision, where the rules checker identifies at least one destination port for the data frame stored in the external memory 34 based on the corresponding header information, and generates a forwarding instruction in the form of a "port vector". In the exemplary illustrated embodiment, the port vector is a 28-bit vector with a bit set for each output port identified as a destination port to which the data frame should be forwarded. Assuming that the received frame is a unicopy frame, only one bit corresponding to the one destination port is set in the port vector generated by the rules checker 44 or 68. Hence, the rules checker uses the port vector to assign the frame pointer to at least one destination port.

The rules checker 44 or 68 places the port vector and the corresponding frame pointer (as well as a control opcode 206 and a VLAN index 204) into the port vector FIFO 63. The port vector is examined by the port vector FIFO 63 to determine into which particular output queue 67 (or queues) the frame pointer associated with the port vector should be written. The port vector FIFO 63 assigns the frame pointer to the appropriate destination port(s) by placing the frame pointer into the top of the appropriate output queue 67, queuing the transmission of the data frame from the corresponding destination port. Hence, the frame pointer becomes an "assigned frame pointer," where it is assigned to a destination port.

At some point in time, the assigned frame pointer reaches the bottom of the output queue 67 after passing through the output queue 67. The buffer manager 65 takes the assigned frame pointer from the bottom of the output queue 67 using a frame pointer read bus 86, fetches the corresponding data frame in a DMA transaction from the location in external memory 36 pointed to by the assigned frame pointer, and places the fetched data frame into the appropriate transmit FIFO 66 via a data bus 82 (see FIG. 2) for transmission by the corresponding MAC layer.

A multicopy transmission is similar to the unicopy transmission, except that the port vector has multiple bits set, designating the multiple destination ports from which the frame will be transmitted. The frame pointer is assigned (i.e., stored in) each of the appropriate output queues 67 and transmitted from the corresponding transmit FIFOs 54.

The buffer manager 65 uses the special control queues, e.g., the free buffer pool 104, the multicopy queue 90, the reclaim queue 98, and the multicopy cache 96 to manage the process of allocating buffers to store received data frames, and retrieving buffers for re-use once the frame has been transmitted to its designated output port(s). The buffer manager 65 also maintains "overflow" regions in external memory 36 for the output queues 67, 75, 76, 77 and the control queues 104, 90 and 98. Specifically, these queues each include a three-part configuration including on-chip and off-chip storage locations. On-chip storage is preferable for high performance, where all of the queuing structure is maintained on the chip (referring to the multiport switch 12). However, the real estate on a chip is very expensive and real estate costs create a problem when the chip is designed to switch, and needs to queue, a large number of entries. The present invention solves this dilemma by providing a single output queue that includes a high performance, low capacity section that is on-chip, and an overflow area that is off-chip, i.e., is implemented on a separate discrete memory chip 34. The overflow area thus allows the queue to serve as a large capacity queue as needed, and is configured within the output queue in a manner that the a relatively lower performance of the off-chip overflow area does not adversely affect the overall performance of the output queue.

Each logical queue 67, 75, 76, 77, 90, 98, and 104 of the present invention includes a write-side queue 76 and a read-side queue 78 located on the chip 12, and an output queue overflow area (generally designated as 110) located in an assigned portion of the external memory 34. Access to the external memory 34 for all of the output queues 67 is through the external memory interface 32, as described earlier. The present invention takes advantage of the bursting nature of current external memories, so that the overflow data (e.g., frame pointers) is sent on and off the chip to the overflow queue area 110 in bursts over the bus 84 to the external memory 34.

The write-side queue 76 and the read-side queue 78 located on the chip 12 are considered to be small, expensive, and high-performance resources. By contrast, the overflow area 110, forming the third part of the output queue 67, provides a large, inexpensive, low-performance, large capacity path.

Each buffer 67, 75, 76, 77, 90, 98, and 104 operates by the corresponding write-side queue 76 receiving the corresponding frame pointer entry at an input end of the write-side queue 76. The frame pointer points to the first buffer location in external memory storing the first 256 bytes of a data frame.

After the entry flows through and reaches the output end at the bottom of the write-side queue 76, control logic associated with the output queue 67 selects whether the entry should be output to the corresponding assigned portion 110 of the external memory 34 or the read-side queue 78. If there is available space in the read-side queue 78, and the overflow area 110 for that output queue 67 is empty, then one or more entries are passed directly from the write-side queue 76 to the read-side queue 78. This passing of the entry or entries directly from the write-side queue 76 to the read-side queue 78 is performed entirely on the chip 12, and thus provides a low-latency, fast flow-through of an entry.

If the read-side queue 78 is full, but there is not yet a burst-size amount of data in the write-side queue 76, then the entry remains in the write-side queue 76. If the read-side queue 78 is full and there is at least a burst-size amount of data (e.g., 16 bytes worth of entries) in the write-side queue 76, then the data is written in a burst fashion by the buffer manager 65 into the overflow area 110 in the corresponding assigned portion of the external memory 34. Eventually, the read-side queue 78 will empty, and if there is data in the overflow area 110, the buffer manager 65 will supply a burst of data from the overflow area 110 into the read-side queue 78 when the read-side queue 78 has enough space to accommodate the burst-size amount of data. Hence, the read-side queue 78 selectively receives the frame pointer from the write-side queue 76 or the assigned portion 110 of the external memory 34.

Hence if an output queue 67 begins to receive a large number of entries (e.g., frame pointers), these entries can be placed into the overflow area 110 to avoid overflowing the on-chip queue 78, minimizing possibility of discarding frames. The total amount of memory dedicated to the overflow areas 110 may also be readily changed by changing the size of the external memory 36. Furthermore, the sizes of the individual specific overflow areas 110 are programmable to customize the queue sizes, without impacting the performance of the output queues 76.

The multiport switch as depicted in FIGS. 1 and 2 has twenty-eight output queues serving the twenty-four 10 Mb/s user ports 60, the two 100 Mb/s server ports 62, the management port 36, and the expansion bus port 39, respectively. The output queues 67, 75, 76 and 77 provide temporary storage for frame pointers when they are queued for transmission. Queuing takes the form of the port vector FIFO 70 writing frame pointers into the various output queues 67, 75, 76 and 77 indicated in a forwarding port vector.

Figure 4:
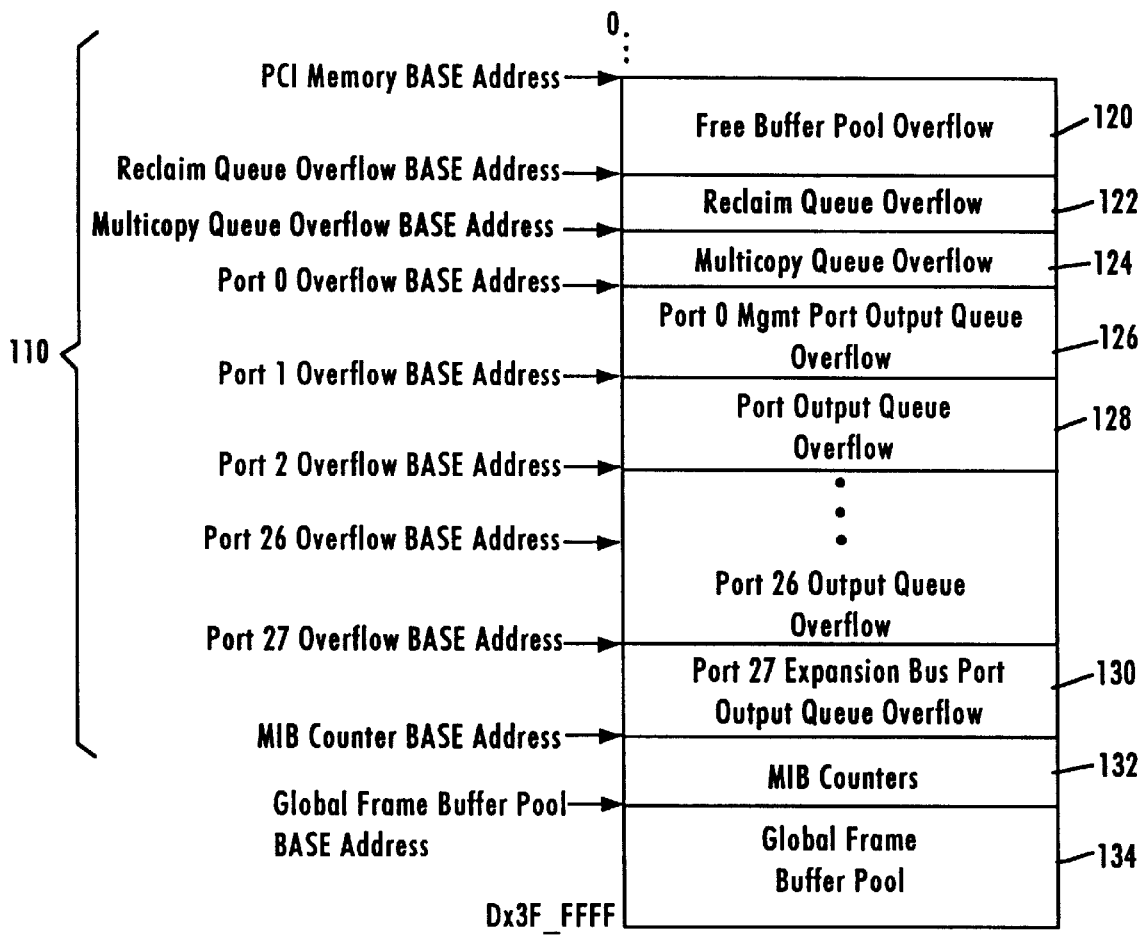
FIG. 4 is a memory map diagram of the external memory of FIG. 1, configured in accordance with an embodiment of the present invention.

FIG. 4 is a diagram illustrating an exemplary map of the external memory 34. The overall capacity of the external memory 34 may be, for example, 4 Mb, although other capacity memories are employed in different embodiments. The use of an external memory 34 for the overflow areas according to the present invention permits increasing or decreasing the size of the output queues by simply changing the external memory. This is an advantage over systems in which the queue structure is entirely on the chip, as the overall queuing capacity is set at manufacture of the chip.

To satisfy the overflow storage requirements of the switch 12, the overflow region 110 of the external memory 34 has assigned memory portions for a free buffer pool overflow 120, a reclaim queue overflow 122, a multicopy queue overflow 124, a management port output queue overflow 126, output queue overflows 128 for each of the 10 Mb/s and 100 Mb/s destination ports (Ports 0–26), and an expansion bus port (Port 27) output queue overflow 130. The memory 34 also includes assigned portions for the MIB counters 132, and the global frame buffer pool 134.

The BASE Address for the entire memory region is programmable in a memory base address register among the registers 74 on the chip (see FIG. 2). The BASE Address for each area in the external memory map is programmable in the register set. No length register is required, since the length for a given area is equal to the area from that area's BASE Address to the BASE Address of the next adjacent area in the mapping.

Since the length (and therefore capacity) of each of the individual overflow areas is programmable, the overall capacity of each queue is programmable. This feature of the present invention permits customization of the switch to provide particular output queues with increased capacity, as needed.

The overflow areas 110 store excess entries that do not fit into the control queues on the chip 12. For example, the free buffer pool overflow area 120 stores for the free buffer pool 104 the excess free frame pointers identifying the currently unused buffers in the global frame buffer pool 134. The reclaim queue overflow area 122 stores for the reclaim queue 98 excess frame pointers to linked-list chains that are no longer needed. The multicopy queue overflow area 124 stores for the multicopy queue 90 excess frame pointers with copy numbers ">=1" (for queued frame pointers) and frame pointers with copy numbers "−1" (for successfully transmitted frames). The management port output queue overflow area 126 stores for the management port queue 75 excess assigned frame pointers awaiting transmission to the management port 36 (Port 0). Output queue overflow areas 128 store excess assigned frame pointers awaiting transmission to the appropriate 10 Mb/s ports (Ports 1–24) or 100 Mb/s ports (Ports 25–26) for the respective port queues 67. The expansion bus port output queue overflow area 130 for the expansion bus port (Port 27) queue 77 stores frame pointers awaiting transmission to the expansion bus port.

The MIB counter region 132 contains all the per port statistics which are updated periodically by the switch 12. The switch 12 maintains 8-bit and 16-bit counters on-chip for storing MIB statistics. The switch 12 updates the 32-bit or 64-bit MIB counters in external memory 36 with the frequency required to prevent loss of MIB data.

The global frame buffer pool 134 contains buffers in linked-lists which store received frame data. At any given time, these linked lists contain valid frame data, obsolete buffers which will be returned by the buffer manager 65 to the free buffer pool 104, or locations owned by the PCI host processor (not shown).

MANAGEMENT DATA FRAME SYNTHESIS

The present invention is directed to the synthesis of a management data frame that includes at least a portion of a selected received data frame, and new information that specifies characteristics corresponding to the reception of the selected data frame. For example, the new information may specify the source of the data frame based upon a network port 60 or 62 having received the data packet, or based upon the source address in the data packet. Similarly, the new information may specify the destination of the received data packet based upon the destination address. As such, the new information may be used by the management agent to monitor network traffic between two network ports, or alternatively between two network stations based on the corresponding MAC addresses.

The new information may also specify the receive status with respect to the data packet itself or the network switch 12. For example, the new information may specify whether the received data packet had a frame alignment error, a cyclic redundancy check (CRC) error, or whether the receive FIFO 64 receiving the data packet encounters an overflow. The new information may further specify the characteristics of the multiport switch 12 itself in response to reception of the data frame. As described above, the rules checker 44 or 68 determines the destination of the received data packet based upon the source address and the destination address. It may be desirable in some cases to provide information to the management agent related to the capabilities of the appropriate rules checker. For example, if the source address of the received data packet was unrecognizable and had to be registered (i.e., learned) by the new network switch 12 as a new station on the network, the new information may be used by the management agent to begin monitoring the new station. Alternatively, the management agent may use the new information to reconfigure the network switch 12 for the new station, for example by reallocating buffers or resetting network port configuration registers. The management frames may also be used to monitor traffic between two stations.

Hence, the new information generated by the multiport switch 12 for the management data frame enables a management agent to receive precise information related to the status of the multiport switch based upon reception of data frames, as well as selectively monitoring selected ports or based upon data packets having prescribed source or destination addresses. Hence, the management interface 36 will output a plurality of management data frames, each including new information specifying characteristics corresponding to reception of the selected data frame, for example received status, data packet characteristics, and switch response characteristics to receiving the data frame.

Figure 10A:
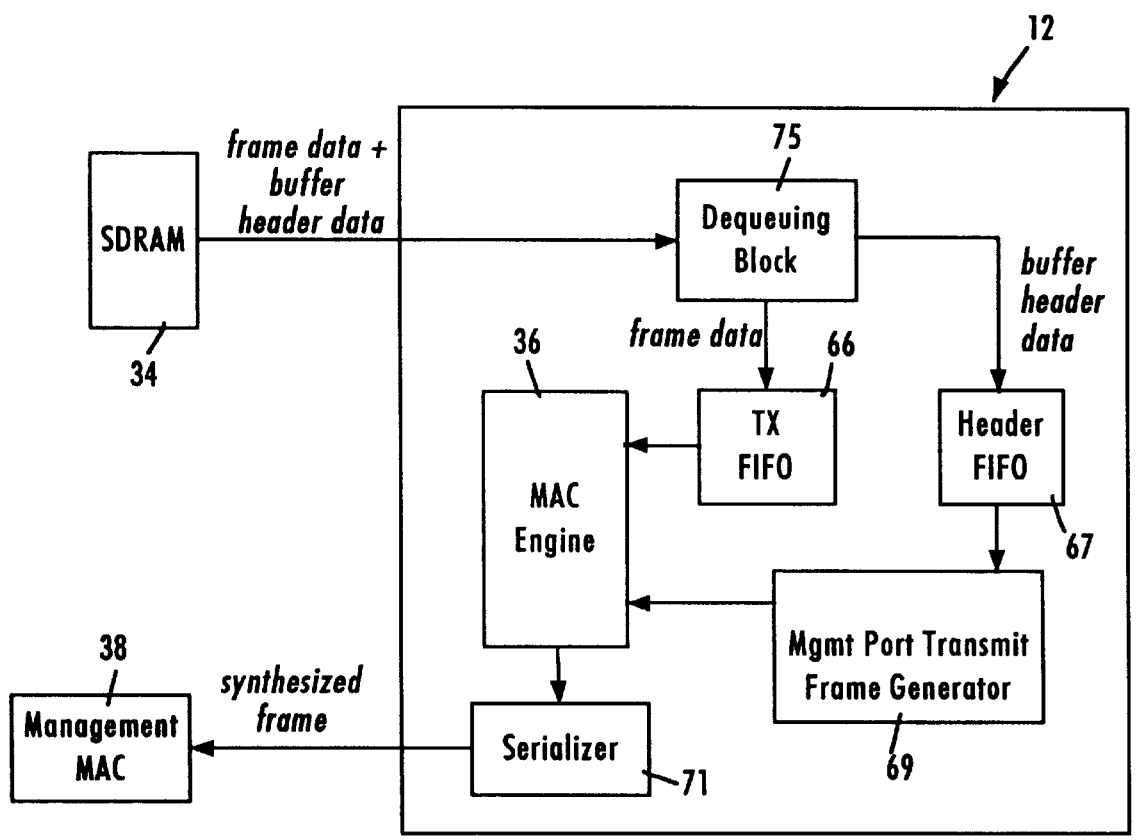
FIGS. 10A and 10B are diagrams of the apparatus and method for generating a management data frame for the management agent according to an embodiment of the present invention, respectively.
Figure 10B:
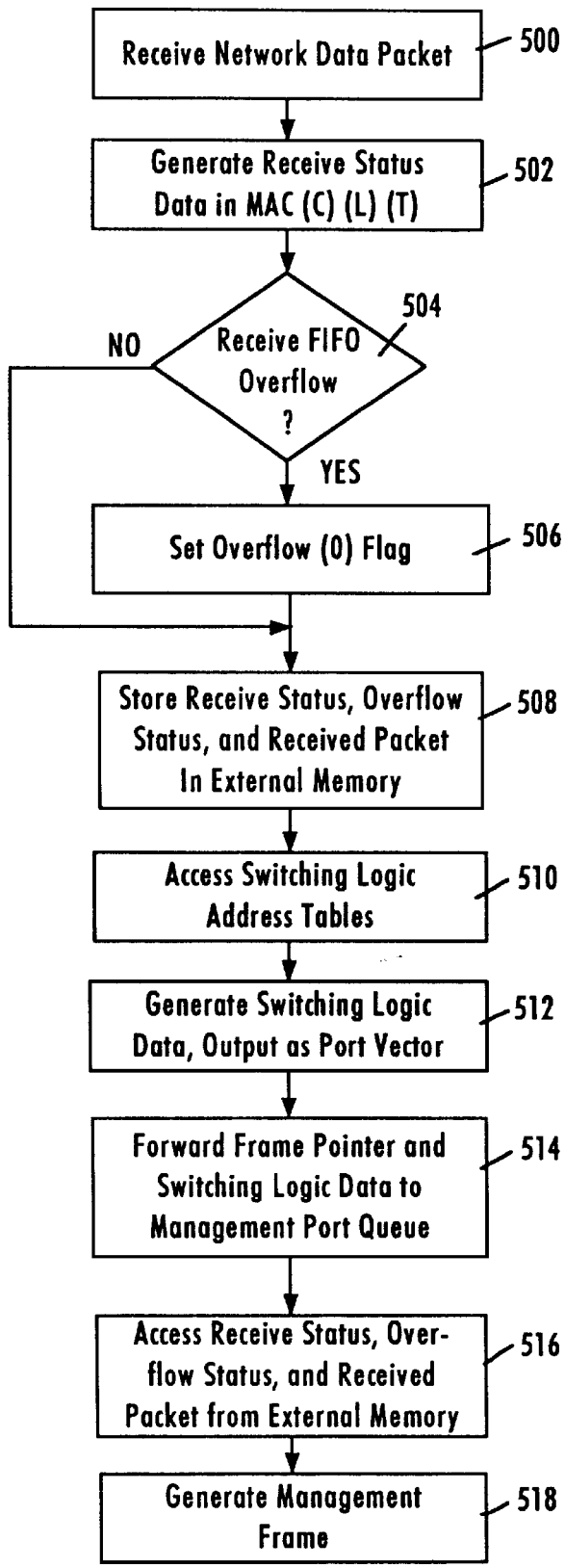

FIG. 10A is block diagram illustrating the apparatus within the network switch 12 for generating a management frame for the management agent, and FIG. 10B is a diagram of a method for generating the management frame, according to an embodiment of the present invention. The method begins in step 500 by receiving a data packet by a MAC port 60 or 62 from one of the network stations 14 or 16. The new management information for the management data frame is generated by selectively compiling relevant information from different sources within the switch.

Figure 9A:
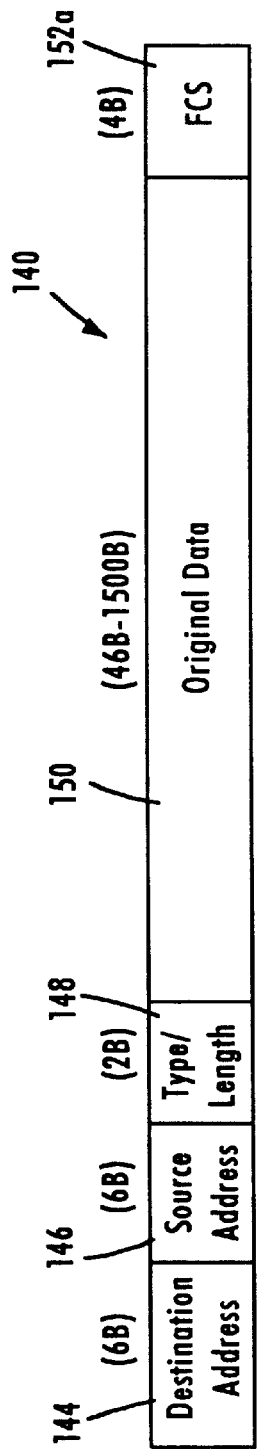
FIGS. 9A and 9B are diagrams illustrating the structure of a network data packet having untagged and tagged frame formats, respectively.
Figure 9B:
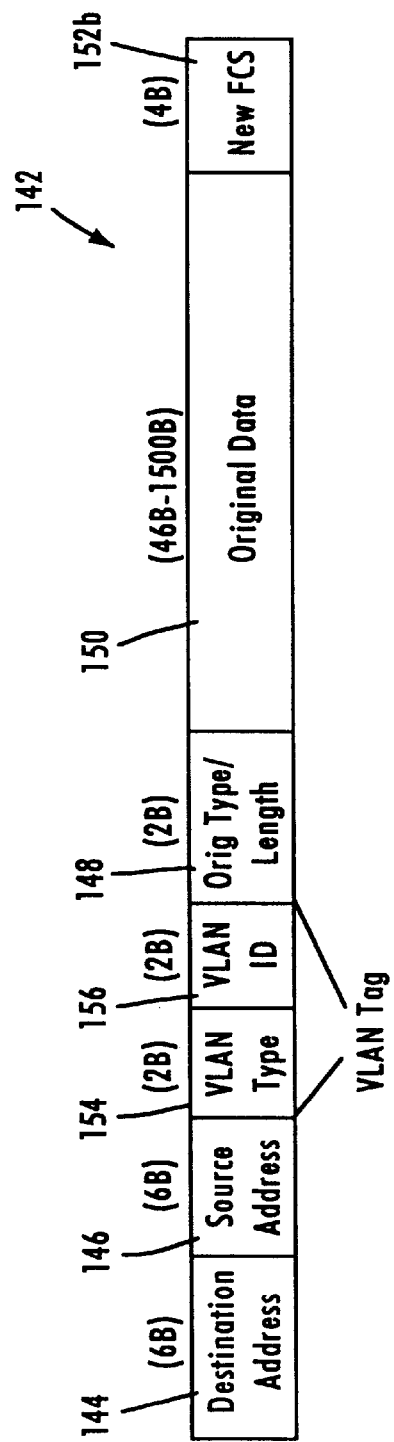

Reception characteristics are determined in step 502 by the MAC 60 or 62 receiving the data packet to generate receive status data. Specifically, the MAC 60 or 62 receives the incoming data frame and checks to ensure that the data packet is compliant with Ethernet protocol with respect to minimum and maximum legal packet size. An exemplary network data packet is shown in FIG. 9A for untagged frame format, and FIG. 9B for tagged frame format (IEEE 802.1d and/or IEEE 802.3ac and 802.1Q). Each untagged frame 140 and tagged frame 142 includes a 6 byte destination address field 144, a 6 byte source address field 146, a type/length field 148 (2 bytes), a variable length data field 150 having a field width of 46 bytes to 1500 bytes, and a frame check sequence (FCS) field 152 (4 bytes), which includes the cyclic redundancy check (CRC) field. The tagged frame 142 also includes a VLAN tag including a 2 byte VLAN Ethertype field 154 and a 2 byte VLAN ID field 156. As recognized in the art, both the untagged frame 140 and the tagged frame 142 will be preceded by a 56 bit preamble, and an 8 bit start frame delimiter (SFD).

The frame check sequence field 152, also referred to as the CRC field, serves as an error check code for the received data packet, where the MAC 60 or 62 checks for any errors using the CRC field 152. As recognized in the art, each data packet needs to have its own unique CRC field 152 in order to accurately detect any errors in the received data frame. The MAC layer 60 or 62 receiving the data frame determines in step 502 if there exists any CRC errors (C) or any frame alignment errors (L), and sets the appropriate flag upon detecting the corresponding error. If the received packet is a tagged frame, a corresponding bit (T) is set by the MAC. The received data packet is then put in the corresponding receive FIFO 64 for storage by the buffer manager 65 to the external memory 34. If in step 504 there is an overflow of the receive FIFO 64, the MAC sets an overflow flag bit (O) in step 506 to indicate possible data loss. The receive status data (including C, L, O, and T flag bits and receive port ID) and the received data packet are then stored in the external memory 34 in step 508.

Figure 5:
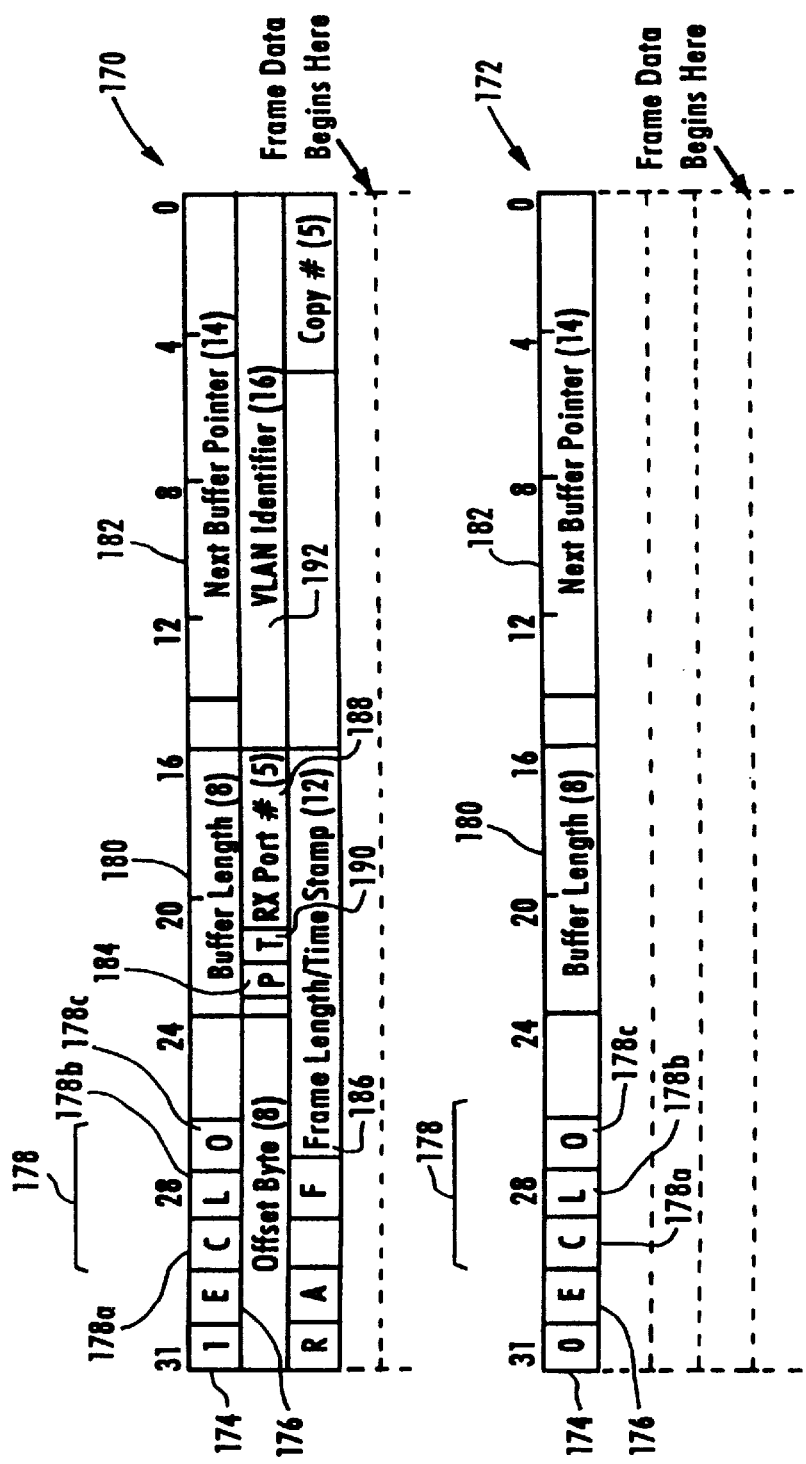
FIG. 5 is a diagram illustrating a frame buffer header format for the buffer regions of FIG. 4.

FIG. 5 is a diagram illustrating the frame buffer header format for buffers in the external memory 34 storing the received data frame. The buffers are chained together by address pointers in each buffer header that indicate the next buffer's location in memory. The buffer headers also include the received status information transmitted by the corresponding MAC having received the data packet. Specifically, the first buffer header 170 and the subsequent buffer header 172 include a buffer format bit 174, an end of frame marker 176, receive status data 178, buffer length 180, and a next buffer pointer 182. The buffer format bit 174 specifies the format of the header as a first buffer header (having 12 bytes) or a subsequent buffer header (having 4 bytes), and is used for chaining buffers. The end of frame marker 176 specifies that the corresponding buffer header is the last buffer for a frame when the bit is set to one, indicating there are no more buffers in the chain. The buffer length 180 specifies the total number of bytes which are valid in the data field of the buffer beginning with the first byte after the buffer header, and the next buffer pointer 182 includes the pointer to the next buffer. The next buffer pointer 182 will not be valid when the end of frame marker 176 is set.

The first buffer header 170 and the subsequent buffer header 172 includes receive status data 178. The C bit 178a indicates whether a CRC error was detected by the MAC. The L bit 178b b indicates whether a frame alignment error was detected along with the CRC error in the receive frame by the MAC 60 or 62. The O bit 178c indicates whether the receive FIFO 64 overflowed, indicating that the data in the buffer may not be valid. The first buffer header 170 also includes a P bit 184 that specifies the port type of the incoming receive frame, where a zero indicates a 10 Mb/s port and a 1 indicates a 100 Mb/s port. The P bit 184 can be used by the host, in conjunction with the time stamp field 186, when the multiport switch 12 is programmed to forward frames to the expansion bus before the frame is completely received and buffered to external memory. The first buffer header 170 also includes a receive port number 188 specifying the port number port from which the frame was received, and a T bit 190 that indicates whether the received frame type was tagged or untagged. The first buffer header 170 also includes the VLAN identifier 192 from the VLAN fields 154 and 156.

Hence, the MAC layer 60 or 62 determines the receive status of the received data packet, and forwards the information in step 508 for storage in the buffer header 170 stored in the external memory 34. Storage of the received status data with respect to the condition of the received data frame (e.g., error-free, CSC error, frame alignment error) as well as the status of the receive port receiving the data packet (e.g., receive FIFO overflow, etc.) enables the multiport switch 12 to collect new information relevant to the reception of the received data packet for use by the management agent. This new information generated by the MAC layer 60 or 62 at the receive port is thus stored in the buffer header 170 as part of the new management information to be provided to the management entity, described in detail below.

Information specifying the characteristics of the multiport switch in response to reception of the data packet is also generated by the appropriate rules checker 44 or 68 during the frame forwarding decision for the received data packet. The rules checker receives information to begin the process of generating the forwarding port vector shown in FIG. 6. During this process, the rules checker receives information from the MAC receiving the data packet to generate the forwarding port vector 200 shown in FIG. 6. For example, the rules checker will receive the destination address field 144, the source address field 146, the receive port number, and the frame pointer. If the frame is received by a tagged port, the VLAN tag including the VLAN type field 154 and the VLAN ID field 156 is stripped from the incoming frame and supplied to the rules checker and the external memory at the buffer header 170 in the VLAN identifier field 192.

The rules checkers 44 or 68 serve as the switching logic of the switching subsystem 70 shown in FIG. 3. Switching logic includes switching logic data that specifies whether the received data frame should be forwarded to the management agent via the management port 36. The rules checker contains a set of addresses, along with VLAN associations and forwarding port vectors. The rules checker searches its address tables for the appropriate addresses in step 510 and makes a forwarding decision based upon the source address, receive port, DA, and VLAN associations.

The rules checker address table contains sufficient information for the rules checker to generate a forwarding decision based upon the source address/receive port number and destination address/VLAN index. For example, the rules checker address table will include traffic capture bits (e.g., traffic capture 1 and traffic capture 2) that identify whether the source and destination MAC address for a selected MAC address or port destination should be output to the management port. The rules checker address table will also include a VLAN index used to reference the 16-bit VLAN identifier. The address table will also include a port number identifying the port on which the associated address resides, and a port vector which provides the forwarding vector for forwarding frames.

Figure 6:
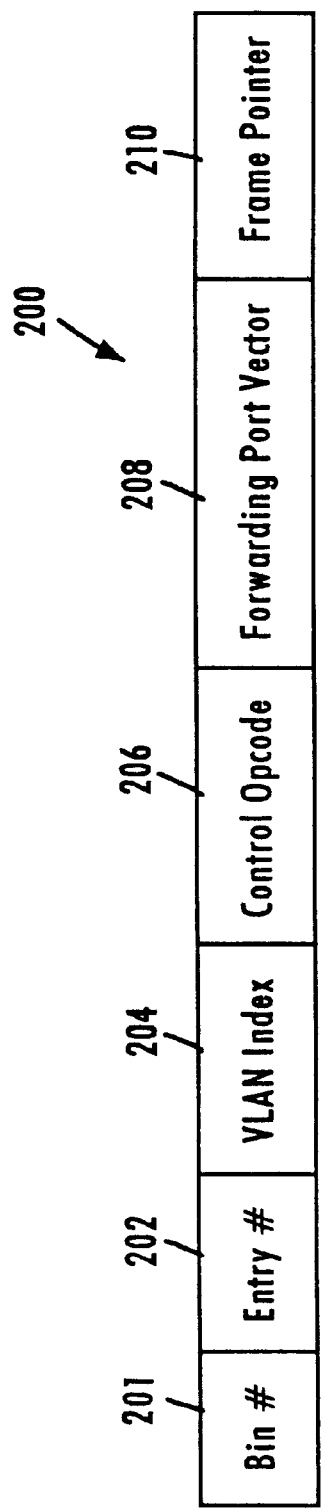
FIG. 6 is a diagram illustrating a port vector generated by the rules checker of FIG. 3.

The rules checker will generate switching logic data in the form of a port vector 200 in step 512, and output the port vector 200 to the port vector FIFO 63, shown in FIG. 3, for transmission of the received data packet to the select output ports, including the management port 36. As shown in FIG. 6, the port vector 201 includes a bin number 200 and an entry number 202 which form an index for use by the management agent in locating the rules checker address table entry. The vector 200 also includes the VLAN index 204, a control Opcode 206, the forwarding port vector 208 which identifies the destination ports, and the frame pointer 210 which specifies the location in the external memory 34 storing the frame data and the corresponding header information as shown in FIG. 5.

The address index formed by the bin number 201 and the entry number 202 enables the management agent to access the specific rules checker address table entry generating the switching decision for the corresponding received frame. Specifically, the management agent is responsible for building and maintaining the address table for the rules checker 68 or the external rules checker 44 via the external rules checker interface 42. The management agent generates the initial list of all entries in the address table, inserts addresses and their associated fields into the table, manages a software mapping of the address table in order to properly validate, add, delete, or age entries, and updates fields within address entries.

In addition, the rules checker is capable of learning about the presence of a new station 14 or 16 on the network. For example, a new station having a predetermined MAC address may send a data packet to another station via the multiport switch 12. If the rules checker does not include an address table entry for the source address identified in the source address field 146 of the received data packet, the rules checker is capable of "learning" about the new station by updating its internal address tables to include a new address table entry for the new source address. Once the new address table entry has been formed, the rules checker can properly generate the forwarding port vector.

Figure 7:
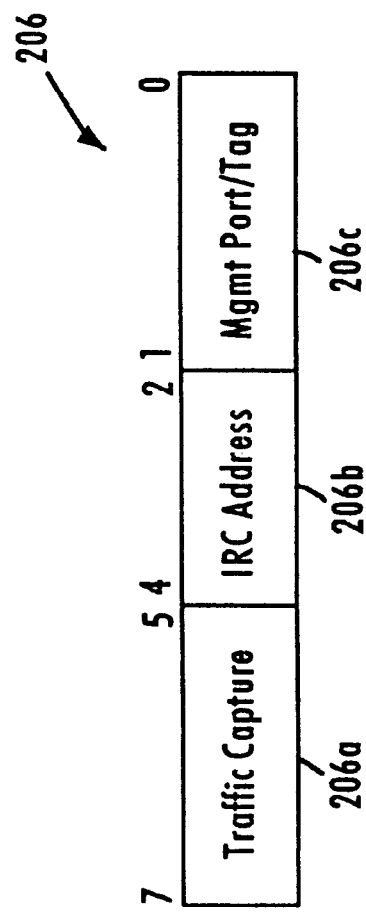
FIG. 7 is a diagram illustrating the structure of the operation control field of FIG. 6.

FIG. 7 is a diagram illustrating the subfields of the central Opcode field 206. The control Opcode field 206 provides information generated by the rules checker in step 512 related to the identify of the received frame and/or the characteristics of the rules checker in response to receiving the received data packet. Table 1 lists exemplary codes within the control Opcode field 206 that provide information for the management agent with respect to the identity of the received data packet and/or the status of the rules checker in response to reception of the data frame.

TABLE 1

| Opcode Field | Field Name | Description |
| --- | --- | --- |
| 7–5 | Traffic Capture | 000 = Null<br>001 = Sniffer Port Frame<br>010 = Traffic Capture 1 Frame<br>011 = Traffic Capture 2 Frame<br>100–110 = Reserved<br>111 = Reserved (identifies additional opcode field) |
| 4–2 | IRC Address | 000 = Known SA<br>001 = Reserved (Known SA with High Priority)<br>010 = Unknown SA learned (auto-validated or not validated)<br>011 = Unknown SA not learned; Not learning or Bad Frame<br>100 = Unknown SA not learned; Bin or Free Entry Chain was locked<br>101 = Unknown SA not learned; no more room in Address Table<br>110 = Unknown VLAN tag (VLAN Identifier not recognized)<br>111 = Backbone Forwarding Mode SA Match Error |
| 1–0 | Mgmt Port/ Tagging | 00 = Null<br>01 = BPDU or Bridge Multicast Frame<br>10 = Directed Frame (DA = an internal IMS port)<br>11 = Disable "tag" on tagged port (for 100 Mb/s tagged ports) |

As shown in Table 1 and FIG. 7, the control Opcode 206 includes three subfields, namely traffic capture 206a, IRC address 206b, and management port/tagging 206c. The traffic capture field 206a specifies if the received data packet is captured from monitored traffic. For example, the traffic capture field code "001" specifies a sniffer port frame, where the "sniffer port" specifies that all traffic on the identified port is forwarded to the management agent. For example, assuming "MAC 23" in FIG. 2 was designated a sniffer port, then the management agent would be notified by a management interface 36 of every data packet transmitted and received by the "MAC 23." Similarly, the traffic capture 1 frame and traffic capture 2 frame codes enable the management agent to monitor traffic occurring between two ports or two MAC addresses in the event that more than one MAC address is present on a given half-duplex network port.

The IRC address subfield 206b includes characteristics of the internal rules checker 68 in response to reception of the data frame. For example, the IRC address field value 000 specifies that the source address has a corresponding address table entry in the rules checker. Conversely, the IRC field values "010" to "101" specify an unknown source address, along with whether or not the unknown source address was learned by the internal rules checker 68. In the event that unknown source address was not learned, different error conditions provide additional information for the management agent why the unknown source address was not learned, for example bad frame, no more room in the address table, or bin or free entry chain was locked (e.g., the memory structure storing the address table was locked). The specific error conditions may enable the management agent to reconfigure the internal rules checker address table entries to recognize the unknown new station.

The management port/tagging subfield 206c of the control Opcode 206 also specifies the identity of special management frames that may be transmitted or received by the multiport switch 12. For example, a value of "01" specifies a bridge protocol data unit (BPDU) frame or a bridge multicast frame. The BPDU frame is a standardized protocol frame (IEEE 802.1d) that is transmitted between network bridges to establish spanning trees to eliminate redundant data links. The management port value "10" specifies a directed frame, where the destination address specifies a specific one of the MACs 60 or 62 internal to the switch as opposed to the MAC address of another external network station 14 or 16. Hence, the management agent may identify a data frame that has been sent specifically to one of the switch ports. The management port/tagging value "11" specifies that a "tag" for a 100 Mb/s port has been disabled to disable VLAN tagging for a particular frame even though forwarded over a tag enabled 100 Mb/s port.

Hence, the rules checker generates additional information in step 512 specifying operations within the multiport switch as well as the rules checker 44 or 68 in order to enable the management agent to monitor and update the rules checker as necessary. The rules checker forwards the port vector 200 to the port vector FIFO 63 for distribution to the appropriate output ports. If the control Opcode 206 includes the value "xxx110xx" indicating the receive VLAN ID was not recognized, then the VLAN Index will not be forwarded in field 204. However, if the control Opcode does not equal "xxx110xx", then the VLAN ID will be forwarded from the rules checker to the port vector FIFO 63 in field 204.

As described above, the port vector FIFO 63, shown in FIG. 3, receives the port vector 200 and outputs the appropriate information to the output queues specified in the forwarding port vector 208. Assuming that a management frame is to be generated by the management port 36, the forwarding port vector 208 will have the bit corresponding to the management port 36 set, causing the port vector FIFO 63 to forward the frame pointer and the switching logic data to the management port output queue 75 in step 514. Specifically, the port vector FIFO 63 will forward the bin number 201, the entry number 202, the VLAN index 204 (if appropriate), the control Opcode 206, and the frame pointer 210 to the management port output queue 75, shown in FIG. 10A.

Once the management information (including the bin number 200, entry number 202, VLAN index 204, if appropriate, control Opcode 206, and frame pointer 210) have reached the end of the management port output queue 75, the buffer manager 65 accesses the external memory based upon the frame pointer 210 to obtain the stored information in the external memory 34 in step 516, and stores the obtained header information 170 in a header FIFO 67 and the corresponding stored data of the received data packet in the transmit FIFO 66. The management information generated by the receiving MAC (receive status) and the management information generated by the rules checker (switch status) is thus stored in the header FIFO 67. The FIFO 67 then outputs the management information to a management frame generator 69 that generates a 24-byte header 330 for the management data frame 300, shown in FIG. 8A.

The management MAC 36 obtains the management data header from the generator 69 and at least a portion of the received data stored in the external memory 34 from the transmit FIFO 66 to generate the management frame 300 in step 518. Specifically, the management port MAC 36 generates the preamble 302 and start frame delimiter (SFD) 304 according to Ethernet protocol. The management port MAC 36 applies the header from the generator 69, including a destination address 306 corresponding to the base address of the management port MAC 36. Setting the destination address 306 to equal the address of the management port 36 enables the management agent receiving the data packet via the management MAC 38 to identify the received data packet as a management frame. The source address 308 is set by the generator 69 to equal the address of the MAC 60 or 62 having received the data packet. For example, if the data packet was received by "MAC 23," shown in FIG. 2, then the source address 308 would be set to equal the address of the "MAC 23."

The management port 36 then inserts the Opcode field 206 supplied by the generator 69, including the management information as described above with respect to Table 1 and FIG. 7. The management port 36 then adds the bin number 201 and entry number 202, followed by the frame length 148 of the original received frame, shown in FIGS. 9A and 9B. The bin number and entry number fields 200 and 202 need to be supplied only if the received data frame is a learned frame.

The management port MAC 36 then supplies a status field 310 that includes the values of the received status bits CRC error bit 178a, frame alignment error bit 178b, receive FIFO overflow error 178c, and the tagged frame bit 190 specifying whether the original frame was tagged. The status field 310 also includes a compressed frame bit specifying whether the frame has only 128 bytes of the original frame. Specifically, the management port 36 is configured to transmit up to 128 bytes of a received data frame 312 if a truncation feature is set within the management port 36. The original data frame 312 is configured to include the original destination address 134, the original source address 146, the original type length 149, and the data field 150. If truncation is set within the management port 36, then a data field 150 having a length greater than 114 bytes will be truncated, so that only the truncated portion 150' will be transmitted. However, if the data field 150 is less than 114 bytes, then the entire data field will be transmitted.

After the management port 36 has inserted the fields for the data packet 300, the management port 36 generates a new CRC field 314 that accurately reflects the number of bytes in the management frame 300. Once the CRC field 314 is generated by the management port 36, the management frame 300 is output by the management port 36 to the management MAC 38 via a serializer 71 for processing by the management agent.

Hence, the management agent is able to receive a management data frame that includes specific information about the type of data packet received by the multiport switch, the port 60 or 62 receiving the data packet, received status information corresponding to the received data frame itself as well as the received port receiving the data packet, and information generated by the switching logic specifying information related to traffic capture, IRC address learning, and management port tagging. The management frame also includes at least a portion of the received data frame. Hence, the management data frame provides specific detailed information related to the received data packet and the multiport switch's response to the reception of the data packet. Hence, the management agent can receive a plurality of management frames from the management port 36, independent from the order in which the data packets were received by the multiport switch 12. In addition, the information provided by the MAC layer and the rules checker enables the management agent to determine the appropriate course of action, including whether to respond to the monitored traffic, or whether to update the address tables associated with the switching logic of the rules checker 44 or 68.

The management agent may also output a management data packet 400 to the management port 36, shown in FIG. 8B. As shown in FIG. 8B, the management data packet 400 includes a port vector 208' that specifies a group of the network ports to transmit the network packet, and a network data packet 142' to be transmitted by the specified network ports. Hence, the management data packet 400 enables the rules checker to be bypassed, where the port vector is directly supplied to the port vector FIFO 63 for processing. As will be readily apparent from above, the buffer manager will also assign a frame pointer to the network data packet 142', enabling transmission throughout the switch subsystem 70.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. A method in a network comprising the steps of:
receiving a data packet from a network station;
generating new information in response to reception of the received data packet; and
outputting for use by a management agent a new data packet including the new information and at least a portion of the received data packet, the new information specifying characteristics corresponding to the reception of the received data packet.

2. The method of claim 1, wherein the generating step comprises determining as at least one of said characteristics a characteristic of the network switch in response to the reception of the received data packet, the generating step generating the new information based on the determined network switch characteristic.

3. The method of claim 2, wherein:
the network switch includes switching logic for routing data packets to destination network stations, and the data packet has a source address corresponding to the network station;
the determining step comprises determining an ability by the switching logic to recognize the source address; and
the generating step further comprises generating switching logic data specifying the determined ability by the switching logic to recognize the source address.

4. The method of claim 3, wherein the switching logic specifies one of a known source address, an unknown source address learned by the switching logic, and an unknown source address not learned by the switching logic.

5. The method of claim 4, wherein the second generating step comprises generating an index pointer specifying a memory location of address information corresponding to the unknown source address learned by the switching logic.

6. The method of claim 2, wherein the determining step comprises generating as one of said characteristics an overflow flag that specifies an overflow condition in a receive buffer receiving the received data packet and corresponding to the network station.

7. The method of claim 2, wherein the determining step comprises generating as one of said characteristics an error flag specifying an error in the received data packet.

8. The method of claim 1, wherein the generating step comprises generating a new destination address field corresponding to a network switch port configured for sending and receiving data packets to and from the management agent.

9. The method of claim 1, further comprising generating an error check code for the new data packet, wherein the outputting step outputs the new data packet including the new information, the at least a portion of the received data packet, and the error check code.

10. The method of claim 1, wherein the generating step comprises determining as at least one of said characteristics a condition of the received data packet, the new information including the determined condition of the received data packet.

11. The method of claim 10, wherein the step of determining a condition comprises determining a presence of an error in the received data packet.

12. The method of claim 1, further comprising determining as at least one of said characteristics a frame type of the received data packet, the new information including the determined frame type.

13. The method of claim 12, wherein the step of determining a frame type includes identifying the received data packet as one of a management frame, a directed frame having a destination address corresponding to one of the management agent and a port of the network switch, and a monitored frame.

14. The method of claim 13, wherein:
the received data packet includes a source address and a destination address;
the network station includes switching logic; and
the step of determining a frame type further includes identifying by the switching logic the received data packet as said monitored frame based on switching logic data corresponding to at least one of said source address and said destination address.

15. The method of claim 13, wherein:
the data packet includes a source address and a destination address;
the network station includes switching logic, a source port receiving the data packet from the network station, and a destination port, the switching logic configured to select one of the network ports as a destination port based on the destination address; and
the step of determining a frame type further includes identifying the data packet as said monitored frame based on at least one of said source port and said destination port.

16. The method of claim 13, wherein the management frame is one of a Bridge Protocol Data Unit (BPDU) and a bridge multicast frame.

17. The method of claim 1, wherein the generating step comprises generating data within the new information specifying that the new data packet includes only a portion of the received data packet.

18. The method of claim 1, wherein the network switch has a plurality of network ports sending and receiving data packets from respective network stations, the method further comprising receiving from the management agent a management data packet including a network data packet and port vector, the port vector specifying a group of said network ports to transmit the network data packet.

19. A network switch comprising:
a plurality of network ports configured for sending and receiving data frames to and from respective network stations;
a management port configured for sending a management data frame to a management agent, the management data frame including at least a portion of a selected received data frame and new information specifying characteristics corresponding to the reception of the selected data frame; and
a switching subsystem configured for generating at least a portion of the new information for the corresponding received data frame.

20. The switch of claim 19, wherein the switching subsystem comprises switching logic for selecting one of the received data frames as the selected received data frame and generating switching logic data as at least a part of the new information.

21. The switch of claim 20, wherein each of said network ports and said management port each generate a receive status field in response to reception of a corresponding data frame, the switching logic supplying the receive status field for the corresponding selected received data frame for transmission in said management data frame.

22. The switch of claim 21, wherein the receive status specifies at least one of an error in the selected received data frame and a receive buffer overflow in the corresponding network port.

23. The switch of claim 20, wherein the switching logic selects the selected received data frame in response to detecting an unrecognized source address in the selected received data frame, the switching logic generating the switching logic data indicating the detection of the unrecognized source address.

24. The switch of claim 23, wherein the switching logic data generated by the switching logic further specifies if the unrecognized source address is learned as a new recognized source address.

25. The switch of claim 20, wherein the switching logic selects the selected received data frame based on reception on a predetermined one of said network ports, the switching logic data specifying the selected received data frame as received on the predetermined one port.

26. The switch of claim 20, wherein the switching logic selects the selected received data frame based on identifying a predetermined one of said network ports as a destination port for the selected received data port, the switching logic data specifying the predetermined one network port as the destination port for the selected received data frame.

27. The switch of claim 20, wherein the switching logic selects the selected received data frame based on detection of a predetermined one of a source address and destination address in the selected received data frame, the switching logic data specifying the selected received data frame as having the predetermined one address.

28. The switch of claim 20, wherein the switching logic selects the selected received data frame based on identification thereof as a non-network station frame, the switching logic data specifying the selected received data frame as the non-network station frame.

29. The switch of claim 20, wherein the management port receives a second management frame from the management agent, the second management frame including a network data packet and a port vector specifying the network ports to transmit the network data packet.

30. The switch of claim 19, wherein the management port outputs the new information as part of a header for the management data frame.

31. The switch of claim 30, wherein the new information specifies that the management data frame includes the selected received data frame in its entirety.

* * * * *